US011728307B2

(12) United States Patent
Arifeen et al.

(10) Patent No.: US 11,728,307 B2
(45) Date of Patent: Aug. 15, 2023

(54) SEMICONDUCTOR INTERCONNECT STRUCTURES WITH CONDUCTIVE ELEMENTS, AND ASSOCIATED SYSTEMS AND METHODS

(71) Applicant: Micron Technology, Inc., Boise, ID (US)

(72) Inventors: Shams U. Arifeen, Boise, ID (US); Quang Nguyen, Boise, ID (US); Christopher Glancey, Boise, ID (US); Koustav Sinha, Boise, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 17/236,499

(22) Filed: Apr. 21, 2021

(65) Prior Publication Data

US 2022/0344295 A1 Oct. 27, 2022

(51) Int. Cl.
*H01L 23/00* (2006.01)

(52) U.S. Cl.
CPC .............. *H01L 24/13* (2013.01); *H01L 24/11* (2013.01); *H01L 2224/1147* (2013.01); *H01L 2224/13013* (2013.01); *H01L 2224/13014* (2013.01); *H01L 2224/13078* (2013.01); *H01L 2224/13147* (2013.01); *H01L 2224/13155* (2013.01); *H01L 2924/3512* (2013.01)

(58) Field of Classification Search
CPC .. H01L 24/13; H01L 24/11; H01L 2224/1147; H01L 2224/13013; H01L 2224/13014; H01L 2224/13078; H01L 2224/13147; H01L 2224/13155; H01L 2924/3512
See application file for complete search history.

(56) References Cited

U.S. PATENT DOCUMENTS

2011/0101520 A1* 5/2011 Liu ..................... H01L 23/4824 257/737
2011/0260317 A1* 10/2011 Lu ........................... H01L 24/11 257/E23.079
2011/0266667 A1* 11/2011 Wu ......................... H01L 24/11 257/E23.079
2015/0262953 A1* 9/2015 Lee ......................... H01L 24/13 257/737
2016/0079193 A1* 3/2016 Arvin ...................... H01L 24/11 438/614
2019/0013284 A1* 1/2019 Fang .................. H01L 21/4853
2022/0059483 A1* 2/2022 Wu ......................... H01L 24/16

FOREIGN PATENT DOCUMENTS

CN 105873716 B * 11/2018 ................ B22F 1/00

* cited by examiner

*Primary Examiner* — Douglas W Owens
(74) *Attorney, Agent, or Firm* — Perkins Coie LLP

(57) ABSTRACT

Semiconductor devices having interconnect structures with conductive elements configured to mitigate thermomechanical stresses, and associated systems and methods, are disclosed herein. In one embodiment, a semiconductor package includes a semiconductor die and a pillar structure coupled to the semiconductor die. The pillar structure can include a plurality of conductive elements made of a first conductive material having a first elastic modulus. The pillar structure can further include a continuous region of a second conductive material at least partially surrounding the plurality of conductive elements. The second conductive material can have a second elastic modulus less than the first elastic modulus.

21 Claims, 11 Drawing Sheets

SEMICONDUCTOR INTERCONNECT STRUCTURES WITH CONDUCTIVE ELEMENTS, AND ASSOCIATED SYSTEMS AND METHODS

TECHNICAL FIELD

The present technology generally relates to semiconductor devices, and more particularly relates to semiconductor devices having interconnect structures with conductive elements configured to mitigate thermomechanical stresses.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some semiconductor packages, the bond pads of a semiconductor die can be electrically coupled to an organic substrate or another semiconductor die via various bonding methods such as a thermo-compression bonding (TCB), reflow, or diffusion bonding. During the bonding operation, conductive pillars are formed on the bond pads and coupled to the substrate via a bond material that is disposed between the conductive pillars and the substrate. To attach the bond material to the substrate, the semiconductor package is heated to heat and reflow the bond material. However, heating the semiconductor package and/or subsequently cooling the semiconductor package can induce significant mechanical stress between the semiconductor die and the substrate due to a mismatch in the coefficients of thermal expansion of these components. Often, the stress can induce cracking of the semiconductor die near one or more of the bond pads, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
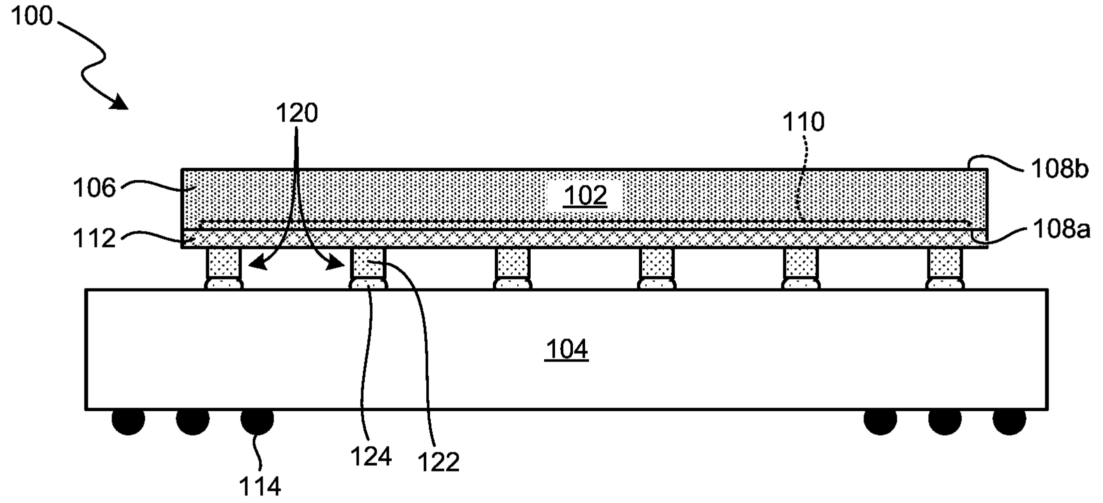
FIG. 1A is a side cross-sectional view of a semiconductor package.

Specific details of several embodiments of semiconductor devices, and associated systems and methods, are described below. In several of the embodiments described below, a semiconductor package configured in accordance with the present technology can include a semiconductor die and a pillar structure coupled to the semiconductor die. The pillar structure can include one or more conductive elements (e.g., a set of copper or nickel columns) electrically coupled to the semiconductor die. The conductive element(s) can be at least partially surrounded by a conductive material (e.g., a solder material). The conductive material can have a modulus that is lower than the modulus of the conductive elements, such that the pillar structure is less stiff and/or more flexible compared to conventional semiconductor pillars (e.g., pillars made entirely of a single metallic material). As a result, when the package is subjected to stress (e.g., thermomechanical stress), the pillar structure can bend and/or deform to dissipate at least some of the stress, thereby reducing the amount of stress applied to the interface with the semiconductor die that may be mechanically weaker than the pillar structure. The pillar structures of the present technology are expected to reduce yield loss during manufacturing of semiconductor packages (e.g., after a TCB bonding step and/or reflow step, as a result of thermal cycling and/or thermal shock during package reliability tests, etc.) and to increase the reliability of semiconductor packages during operation (e.g., during power cycling during end-customer use).

A person skilled in the relevant art will recognize that suitable stages of the methods described herein can be performed at the package, wafer, and/or at the die level. Therefore, depending upon the context in which it is used, the term "substrate" can refer to a package-level substrate, a wafer-level substrate or to a singulated, die-level substrate. Furthermore, unless the context indicates otherwise, structures disclosed herein can be formed using semiconductor-manufacturing techniques whose details are well-known to those of skill in the art. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-6C. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a semiconductor package 100 ("package 100"). The package 100 includes a semiconductor die 102 carried by a package substrate 104. In the illustrated embodiment, the semiconductor die 102 includes a semiconductor substrate 106 having a first side or surface 108*a* and a second side or surface 108*b* opposite the first side 108*a*. The first side 108*a* of the semiconductor substrate 106 is an active side or region including one or more circuit elements formed in and/or on the first side 108*a*. In the illustrated embodiment, the semiconductor die 102 further includes an insulating material 112 formed over at least a portion of the first side 108*a* of the semiconductor substrate 106. The package substrate 104 further include electrical connectors 114 electrically coupled to the package substrate 104 and configured to electrically couple the package 100 to external devices or circuitry (not shown). The semiconductor die 102 is electrically coupled to the package substrate 104 via a plurality of interconnect structures 120. In the illustrated embodiment, each of the interconnect structures 120 includes a pillar structure 122 and a bond material 124. The pillar structure 122 is coupled to the semiconductor die 102, and the bond material 124 is coupled to the package substrate 104.

In some embodiments, the package 100 is subjected to thermomechanical stress (e.g., chip-package interaction (CPI) stress) during manufacturing and/or usage. Thermomechanical stresses may be induced, for example, by the assembly process (e.g., DCA methods such as TCB/mass reflow), by thermal cycling and/or thermal shock during component/board level reliability testing, and/or by power cycling during end-customer usage.

Figure 1B:
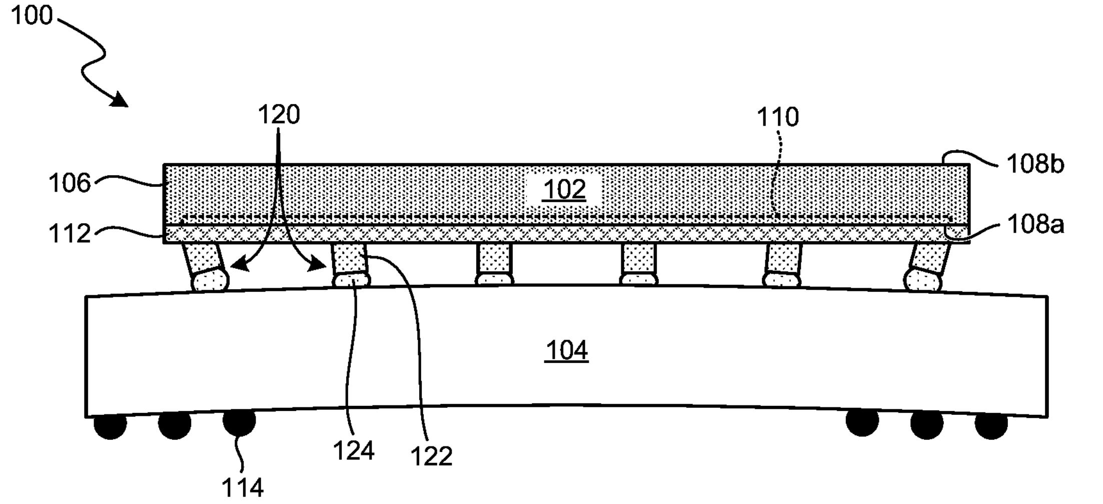
FIG. 1B is a side cross-sectional view of the semiconductor package of FIG. 1A after a TCB/reflow operation.

For example, referring to FIGS. 1A and 1B together, the package 100 is illustrated at the beginning and end, respectively, of a TCB/reflow operation. In FIG. 1A, heating of the package 100 has caused the bond material 124 in the interconnect structures 120 to reflow and electrically connect the pillar structures 122 to the package substrate 104. In some embodiments, the package 100 can be heated to 200° C. or greater (e.g., to 217° C. or greater) to reflow the bond material 124. During the TCB operation, a compressive force can be applied to secure the interconnect structures 120 to the package substrate 104. In FIG. 1B, the package 100 is illustrated at the completion of the TCB operation, after the compressive force has been applied and after cooling the package 100 (e.g., to about 25° C.). By cooling the package 100 at this point, the bond material 124 can be solidified, securing the semiconductor die 102 to the package substrate 104.

In some embodiments, the semiconductor die 102 has a coefficient of thermal expansion (CTE) that is different than the CTE of the package substrate 104, and the CTE mismatch between these components can cause them to deform (e.g., warp, bend) relative to one another during cooling and/or heating of the package 100. For example, the CTE of the semiconductor die 102 (e.g., about 3 ppm/° C.) can be lower than the CTE of the package substrate 104 (e.g., about 14 ppm/° C.). Accordingly, as shown in FIG. 1B, the package substrate 104 can have a warped, non-planar shape after cooling. In other embodiments, the semiconductor die 102, or both the semiconductor die 102 and the package substrate 104, can have a non-planar, warped shape after cooling. The relative deformation of the semiconductor die 102 and the package substrate 104 can introduce mechanical (e.g., thermomechanical) stresses into the package 100 (e.g., CPI stresses) that laterally stress and bend the interconnect structures 120. This can cause cracks to form and propagate at the interface between the interconnect structures 120 and the semiconductor die 102 (e.g., at or within the insulating material 112), which can cause mechanical and/or electrical failures within the package 100.

Figure 2A:
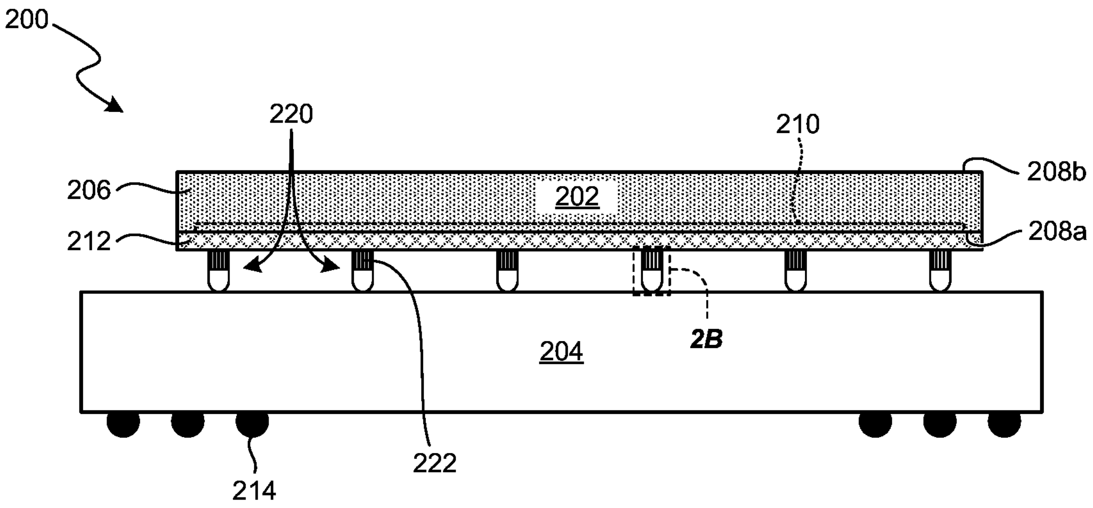
FIG. 2A is a side cross-sectional view of a semiconductor package configured in accordance with embodiments of the present technology.

FIG. 2A is a side cross-sectional view of a semiconductor package 200 ("package 200") configured in accordance with embodiments of the present technology. The package 200 can include a semiconductor die 202 carried by a package substrate 204. In the illustrated embodiment, the semiconductor die 202 includes a semiconductor substrate 206 (e.g., a silicon substrate, a gallium arsenide substrate, an organic laminate substrate, etc.) having a first side or surface 208*a* and a second side or surface 208*b* opposite the first side 208*a*.

The first side 208*a* of the semiconductor substrate 206 can be an active side or region including one or more circuit elements 210 (e.g., wires, traces, interconnects, transistors, etc.) (shown schematically) formed in and/or on the first side 208*a*. The circuit elements 210 can include, for example, memory circuits (e.g., dynamic random memory (DRAM) or other type of memory circuits), controller circuits (e.g., DRAM controller circuits), logic circuits, and/or other circuits. In other embodiments, the semiconductor substrate 206 can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials.

In the illustrated embodiment, the semiconductor die 202 further includes an insulating material 212 formed over at least a portion of the first side 208*a* of the semiconductor substrate 206. The insulating material 212 can include one or more layers of a suitable dielectric material (e.g., a passivation material, a polyimide material, and/or other materials used to cover a surface of a semiconductor device). For example, the insulating material 212 can comprise silicon oxide, silicon nitride, poly-silicon nitride, poly-silicon oxide, tetraethyl orthosilicate (TEOS), etc. In some embodiments, the insulating material 212 can at least partially comprise a dielectric material with a small dielectric constant relative to silicon oxide (a "low-K dielectric material"). Such low-K dielectric materials can include fluorine-doped silicon dioxide, carbon-doped silicon dioxide, porous silicon dioxide, organic polymeric dielectrics, silicon based polymeric dielectrics, etc. Notably, low-K dielectric materials can increase the performance of the package 200, but can be mechanically fragile, e.g., compared to conventional (e.g., higher-K) dielectric materials. Accordingly, the insulating material 212 can be relatively prone to mechanical failure (e.g., cracking, delamination, etc. due to thermomechanical stresses) compared to other portions/components of the package 200.

The package substrate 204 can be or include a redistribution layer, an interposer, a printed circuit board, a dielectric spacer, another semiconductor die (e.g., a logic die), or another suitable substrate. The package substrate 204 can further include electrical connectors 214 (e.g., solder balls, conductive bumps, conductive pillars, conductive epoxies, and/or other suitable electrically conductive elements) electrically coupled to the package substrate 204 (e.g., through pads, traces, vias, and/or other electrically conductive structures in or on the package substrate 204) and configured to electrically couple the package 200 to external devices or circuitry (not shown).

In the illustrated embodiment, the first side 208*a* of the semiconductor substrate 206 faces the package substrate 204 (e.g., in a direct chip attach (DCA) configuration). In other embodiments, the semiconductor die 202 can be arranged differently. For example, the second side 208*b* of the semiconductor substrate 206 can face the package substrate 204 and the semiconductor die 202 can include one or more through-silicon vias (TSVs) extending through the semiconductor substrate 206 to electrically couple the circuit elements 210 to the interconnect structures 220. Moreover, while only a single semiconductor die 202 is shown in FIG. 2A, in other embodiments, the package 200 can include a plurality of semiconductor dies, e.g., one or more additional semiconductor dies stacked on and/or over the semiconductor die 202.

The semiconductor die 202 can be electrically coupled to the package substrate 204 via a plurality of interconnect structures 220 (e.g., bumps, micro-bumps, pillars, columns, studs, etc.). For example, in some embodiments, the semiconductor die 202 includes a plurality of bond pads (not shown) electrically coupled to the circuit elements 210 of the semiconductor die 202. The bond pads can be at least partially exposed through openings in the insulating material 212, such that at least some of the interconnect structures 220 are electrically coupled to corresponding bond pads (e.g., directly or indirectly via an under-bump metallization (UBM) structure). The interconnect structures 220 can also be electrically coupled to bond pads (not shown) formed on the package substrate 204, thereby electrically coupling the circuit elements 210 on the semiconductor die 202 to the package substrate 204. Optionally, at least some of the interconnect structures 220 can be "dummy" structures that are not electrically coupled to electrically active bond pads on the semiconductor die 202 and/or package substrate 204. While six interconnect structures 220 are illustrated in FIG. 2A, the package 200 can include fewer or more interconnect structures 220. For example, the package 200 can include tens, hundreds, thousands, or more interconnect structures 220 arrayed between the semiconductor die 202 and the package substrate 204. The interconnect structures 220 can be configured to mitigate thermomechanical stresses (e.g., due to CTE mismatch between the semiconductor die 202 and the package substrate 204), as described in detail below with reference to FIGS. 2B and 2C.

The package 200 can include other components typically found in semiconductor devices and known to one of skill in the art. For example, the package 200 can further include an underfill or molded material (not shown) formed over the package substrate 204 and/or at least partially around the semiconductor die 202. In some embodiments, the package 200 includes other components such as external heatsinks, a casing (e.g., thermally conductive casing), electromagnetic interference (EMI) shielding components, etc.

Figure 2C:
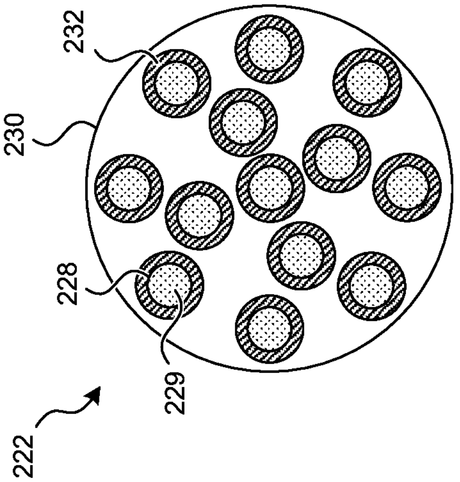
FIG. 2C is an axial cross-sectional view of the interconnect structure of FIG. 2B.
Figure 2B:
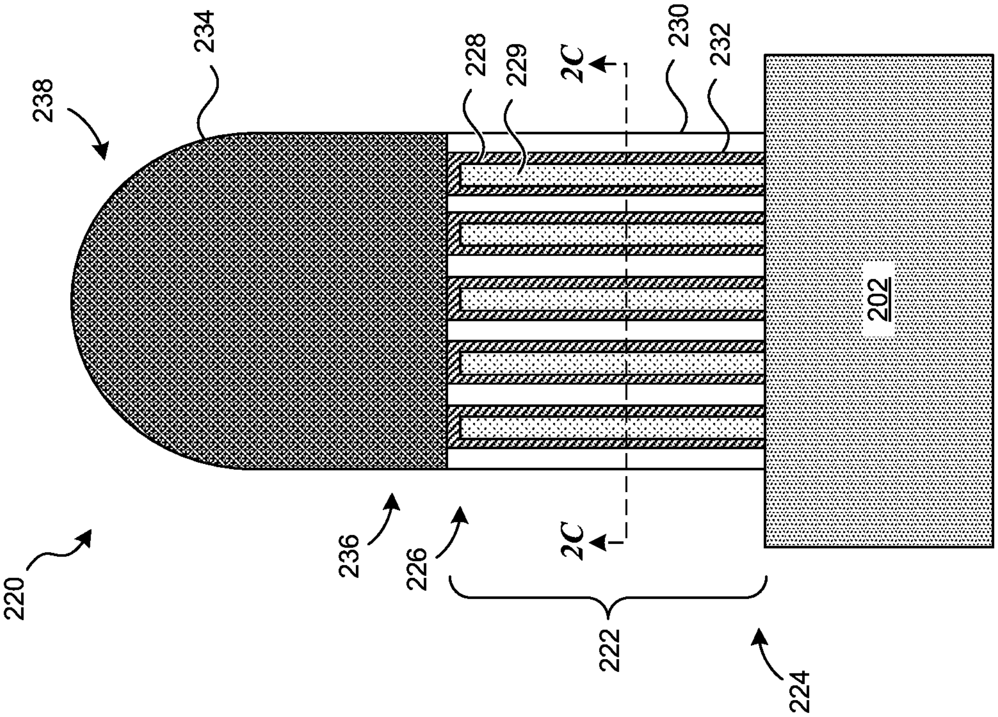
FIG. 2B is a closeup, side cross-sectional view of an interconnect structure of FIG. 2A.

FIGS. 2B and 2C are side and axial cross-sectional views, respectively, of one of the interconnect structures 220 of FIG. 2A. Referring first to FIG. 2B, the interconnect structure 220 includes a pillar structure 222 coupled to the semiconductor die 202 (e.g., to an insulating material and/or bond pad at the surface of the semiconductor die 202—omitted from FIG. 2B merely for purposes of clarity). The pillar structure 222 can have an elongated shape with a first end portion 224 and a second end portion 226. The first end portion 224 can be electrically coupled to the semiconductor die 202 (e.g., to an insulating material and/or a bond pad at the surface of the semiconductor die 202). The second end portion 226 can be opposite the first end portion 224 and located away from the semiconductor die 202.

Referring next to FIGS. 2B and 2C together, the pillar structure 222 can include a plurality of conductive elements 228 that are mechanically and electrically coupled to the semiconductor die 202. For example, the pillar structure 222 can include at least two, three, four, five, six, seven, eight, nine, ten, fifteen, twenty, fifty, or more conductive elements 228. Each conductive element 228 can have an elongate shape extending from the first end portion 224 of the pillar structure 222 to the second end portion 226 of the pillar structure 222. For example, the conductive elements 228 can be configured as columns, rods, posts, fibers, filaments, etc. Although FIG. 2B illustrates each conductive element 228 as having a straight, linear shape, in other embodiments, some or all of the conductive elements 228 can have a curved, curvilinear, zigzag, serpentine, or any other suitable shape. The conductive elements 228 can each have any suitable width and/or diameter, such as a width and/or diameter less than or equal to 10 μm, 5 μm, 2 μm, 1 μm, 500 nm, 200 nm, or 100 nm. The conductive elements 228 can be made of a first conductive material 229, such as copper, nickel, gold, silicon, tungsten, conductive-epoxy, combinations thereof, etc.

Referring again to FIGS. 2B and 2C together, the conductive elements 228 can be partially or entirely surrounded by a continuous region of a second conductive material 230. For example, as best seen in FIG. 2C, the second conductive material 230 can fill the lateral spaces between the conductive elements 228 such that the pillar structure 222 has a solid cross-section with few or no interior voids or gaps. The second conductive material 230 can be electrically coupled to the semiconductor die 202, and can extend from the first end portion 224 of the pillar structure 222 to the second end portion 226 of the pillar structure 222. The second conductive material 230 can be or include any suitable conductive material, such as a solder material (e.g., SnAg-based solder).

As best seen in FIG. 2C, the pillar structure 222 and conductive elements 228 can have circular cross-sectional shapes. In other embodiments, however, the pillar structure 222 and/or conductive elements 228 can have different cross-sectional shapes (e.g., square, rectangular, triangular, etc.). Additional examples of suitable geometries for the conductive elements 228 are provided further below with reference to FIGS. 3A-3F. The conductive elements 228 can be spaced apart from each other and spatially distributed within the pillar structure 222 in various ways. For example, although the illustrated embodiment shows the conductive elements 228 as being evenly distributed throughout the pillar structure 222, in other embodiments, the conductive elements 228 can be clustered near an interior portion of the pillar structure 222, clustered near a peripheral portion of the pillar structure 222, arranged to form a pattern (e.g., linear, circular, triangular, square, etc.) within the pillar structure 222, arranged to form a shape having linear and/or radial symmetry with respect to the pillar structure 222, or any other suitable distribution within the pillar structure.

In some embodiments, the first and second conductive materials 229, 230 are different materials with different physical properties. For example, the first conductive material 229 can have a relatively high elastic modulus (e.g., Young's modulus), such as a Young's modulus of at least 50 MPa, 75 MPa, 100 MPa, 150 MPa, 200 MPa, 500 MPa, 1 GPa, 10 GPa, 25 GPa, 50 GPa, 100 GPa, 200 GPa, 500 GPa, or 1000 GPa. The second conductive material 230 can have a lower elastic modulus than the first conductive material, such as a Young's modulus of less than or equal to 500 GPa, 200 GPa, 100 GPa, 10 GPa, 1 GPa, 100 MPa, 50 MPa, 25 MPa, or 10 MPa. The elastic modulus of the first conductive material 229 can be at least 2 times, 5 times, 10 times, 20 times, 50 times, or 100 times greater than the elastic modulus of the second conductive material 230. In such embodiments, the conductive elements 228 can provide mechanical strength and/or structural integrity to the pillar structure 222, while the second conductive material 230 can dissipate stress (e.g., thermomechanical stress) applied to the pillar structure 222 by deforming (e.g., bending, compressing, etc.). This configuration can advantageously reduce the overall stiffness and/or effective elastic modulus of the pillar structure 222, e.g., compared to a pillar structure made entirely of the first conductive material 229 (e.g., a solid copper pillar). For example, the effective Young's modulus of the pillar structure 222 can be reduced by at least 1%, 5%, 10%, 20%, 30%, 40%, 50%, 60%, 70%, 80%, or 90% compared to the Young's modulus of the first conductive material 229. In some embodiments, the reduced stiffness of the pillar structure 222 mitigates the likelihood of electrical and/or mechanical failure due to applied stress (e.g., thermomechanical stress resulting from CTE mismatch). For example, when stress is applied to the pillar structure 222, the pillar structure 222 can dissipate at least a portion of the stress by deforming (e.g., elastically and/or plastically deforming). The deformation can reduce the amount of stress transmitted to the insulating material 212 of FIG. 2A and/or other portions of the package 200, thus mitigating the likelihood of fracture, cracking, and/or other failures.

The relative amounts of the first and second conductive materials 229, 230 can be varied as desired to tune the overall stiffness of the pillar structure 222. For example, the volume of the first conductive material 229 and/or the conductive elements 228 can be no more than 10%, 20%, 30%, 40%, 50%, 60%, 70%, 80%, or 90% of the total volume of the pillar structure 222. Alternatively or in combination, the volume of the first conductive material 229 and/or the conductive elements 228 can be greater than or equal to 10%, 20%, 30%, 40%, 50%, 60%, 70%, 80%, or 90% of the total volume of the pillar structure 222. The volume of the second conductive material 230 can be equal or substantially equal to the remaining volume of the pillar structure 222. In some embodiments, the ratio of the volume of the first conductive material 229 to the second conductive material 230 can be at least 100:1, 50:1, 20:1, 10:1, 2:1, 1:1, 1:2, 1:5, 1:10, 1:20, 1:50, or 1:100.

The interconnect structure 220 can optionally include a barrier material 232 formed at least partially between the conductive elements 228 and the second conductive material 230. For example, the barrier material 232 can coat the surfaces of the conductive elements 228 that would otherwise be in direct contact with the second conductive material 230. In some embodiments, the barrier material 232 can have a thickness within a range from 1 μm to 5 μm. The barrier material 232 can facilitate bonding between the conductive elements 228 and the second conductive material 230, and/or prevent or reduce the electromigration of the first conductive material 229 of the conductive elements 228. The barrier material 232 can be made of any suitable material, such as nickel, nickel-based intermetallic, gold, tungsten, tantalum, titanium, or an alloy or combination thereof. In other embodiments, however, the barrier material 232 can be omitted (e.g., if the first conductive material 229 exhibits little or no tendency for electromigration).

Referring again to FIG. 2B, the interconnect structure 220 can further include a third conductive material 234 mechanically and electrically coupled to the pillar structure 222. In the illustrated embodiment, the third conductive material 234 has a first end portion 236 that is coupled to the second end portion 226 of the pillar structure 222, and a second end portion 238 that can optionally be coupled to another component, such as the package substrate 204 of FIG. 2A, a second semiconductor die, and/or a second semiconductor device (not shown). In embodiments where the pillar structure 222 includes the barrier material 232, the barrier material 232 can be positioned between the conductive elements 228 and the third conductive material 234, e.g., to facilitate bonding and/or to reduce electromigration.

The third conductive material 234 can be any suitable conductive material, such as a solder material (e.g., SnAg-based solder). In some embodiments, for example, the second conductive material 230 is made of a first solder material and the third conductive material 234 is made of a second solder material. The first and second solder materials can be the same solder material or can be different solder materials. Optionally, the first and second solder materials can have different physical properties. For example, the first solder material (corresponding to the second conductive material 230) can have a first melting temperature and the second solder material (corresponding to the third conductive material 234) can have a second melting temperature lower than the first melting temperature. This can be advantageous in embodiments where the interconnect structure 220 is attached to a package substrate or other component via a TCB/reflow operation, since the first solder material can remain substantially or completely solid to maintain structural integrity and/or avoid voiding or wicking, while the second solder material melts to form the bond. As another example, the first solder material (corresponding to the second conductive material 230) can have a first elastic modulus and the second solder material (corresponding to the third conductive material 234) can have a second elastic modulus higher than the first elastic modulus. In such embodiments, the first solder material can be more compliant to dissipate stress at the pillar structure 222, while the second solder material can be more stiff to resist fracture, cracking, etc.

FIGS. 3A-3F are axial cross-sectional views of pillar structures 322*a-f* configured in accordance with the present technology. The components of the pillar structures 322*a-f* in FIGS. 3A-3F can be generally similar to the components of the pillar structures 222 of FIGS. 2A-2C. Accordingly, like numbers (e.g., conductive elements 328*a-f* versus conductive elements 228) are used to identify similar or identical components, and the discussion of the pillar structures 322*a-f* of FIGS. 3A-3F will be limited to those features that differ from the pillar structures 222 of FIGS. 2A-2C. Additionally, any of the features of the pillar structures 322*a-f* of FIGS. 3A-3F can be combined with each other and/or with the pillar structures 222 of FIGS. 2A-2C.

Figure 3A:
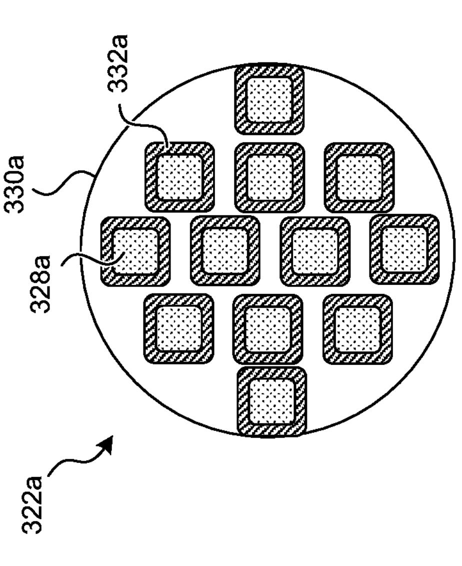
FIGS. 3A-3F are axial cross-sectional views of pillar structures configured in accordance with additional embodiments of the present technology.

FIG. 3A illustrates a pillar structure 322*a* having a plurality of conductive elements 328*a* with square cross-sectional shapes. In the illustrated embodiment, the conductive elements 328*a* have rounded corners, which may be beneficial for reducing stress concentration. In other embodiments, however, the conductive elements 328*a* can have sharp corners.

Figure 3B:
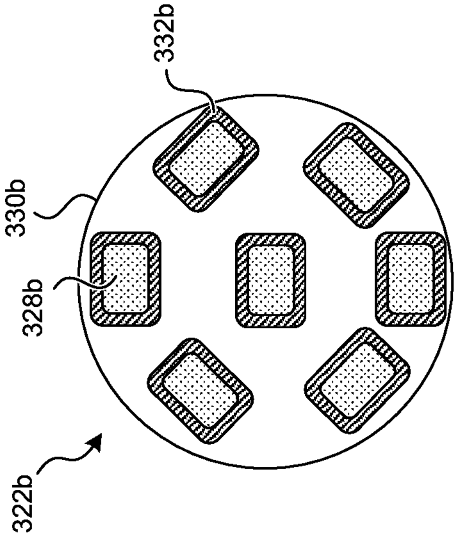

FIG. 3B illustrates a pillar structure 322*b* having a plurality of conductive elements 328*b* with rectangular cross-sectional shapes. The conductive elements 328*b* can have rounded corners (e.g., to reduce stress concentration) or sharp corners, as desired. In still other embodiments, the conductive elements 328*b* can have oval, triangular, diamond-shaped, trapezoidal, pentagonal, or hexagonal cross-sectional shapes, or any other suitable cross-sectional shape.

Figure 3C:
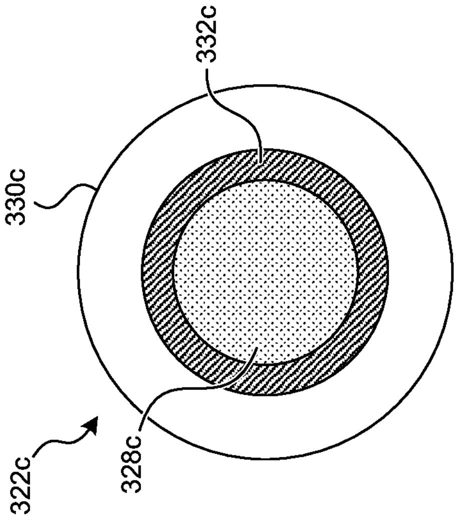

FIG. 3C illustrates a pillar structure 322*c* having a conductive element 328*c* configured as a single column with a circular cross-sectional shape. Although the illustrated embodiment shows the conductive element 328*c* as being centered in the pillar structure 322*c*, in other embodiments, the conductive element 328*c* can be offset from the center of the pillar structure 322*c*. Additionally, in other embodiments, the conductive element 328*c* can have a cross-sectional shape that is oval, square, rectangular, triangular, diamond-shaped, trapezoidal, pentagonal, or hexagonal, or any other suitable cross-sectional shape.

Figure 3D:
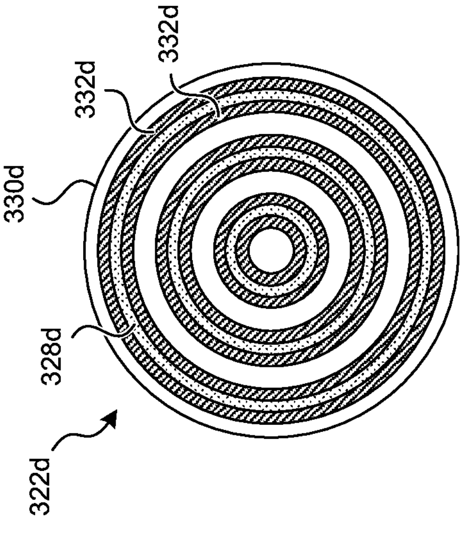

FIG. 3D illustrates a pillar structure 322*d* having a set of conductive elements 328*d* configured as a plurality of nested structures. For example, in the illustrated embodiment, the conductive elements 328*d* are configured as a plurality of nested circular rings. The rings can be arranged in a concentric configuration or can be offset from each other. Although FIG. 3D illustrates each conductive element 328*d* as a being a continuous, closed circle, in other embodiments, some or all of the conductive elements 328*d* can be semi-circles, arcs, circular segments, etc. The pillar structure 322*d* can optionally include a barrier material 332*d* between the conductive elements 328*d* and the second conductive material 330*d*, such that the barrier material 332*d* extends along the interior and/or exterior surfaces of the conductive elements 328*d*.

Figure 3E:
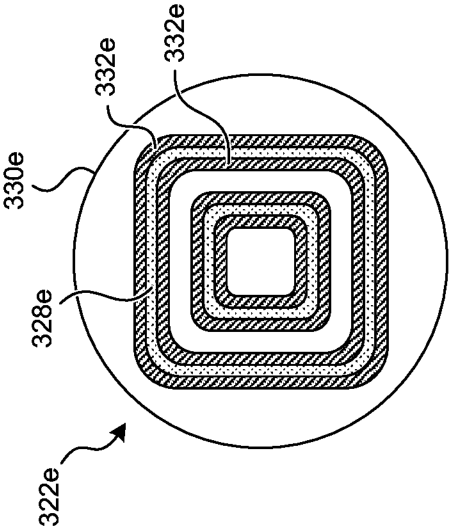

FIG. 3E illustrates a pillar structure 322*e* having a set of conductive elements 328*e* configured as a plurality of nested square rings. In the illustrated embodiment, the conductive elements 328*e* have rounded corners, which may be beneficial for reducing stress concentration. In other embodiments, however, the conductive elements 328*e* can have sharp corners. The conductive elements 328*d* can be arranged concentrically, can be offset from each other, or any other suitable configuration. The pillar structure 322*e* can optionally include a barrier material 332*e* extending along the interior and/or exterior surfaces of each conductive element 328*e*.

Figure 3F:
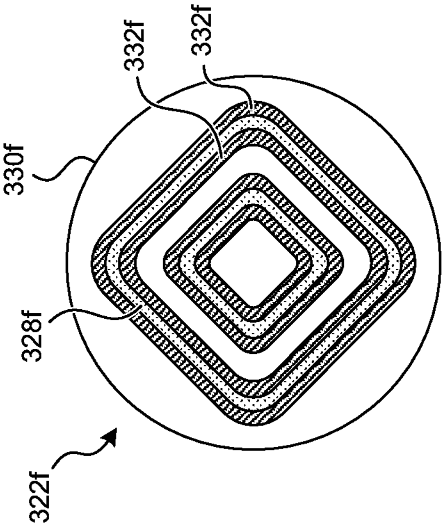

FIG. 3F illustrates a pillar structure 322*f* having a set of conductive elements 328*f* configured as a plurality of nested diamond-shaped rings. The conductive elements 328*f* can have rounded corners or sharp corners, and can be concentric, offset from each other, or any other suitable configuration. In still other embodiments, the pillar structure 322*f* can include nested rings that are triangular, trapezoidal, pentagonal, hexagonal, octagonal, or any other suitable shape. In some embodiments the conductive elements 328*f* can be positioned with respect to each other (e.g., to be concentric). The pillar structure 322*f* can optionally include a barrier material 332*f* extending along the interior and/or exterior surfaces of each conductive element 328*f*.

FIGS. 4A-4K are side cross-sectional views of a semiconductor package at various stages of a manufacturing process or method, in accordance with embodiments of the present technology. The method can be used to manufacture any embodiment of the semiconductor packages described herein, and/or one or more components thereof (e.g., pillar structures 222 of FIGS. 2A-2C, pillar structures 322*a-f* of FIGS. 3A-3F).

Figure 4A:
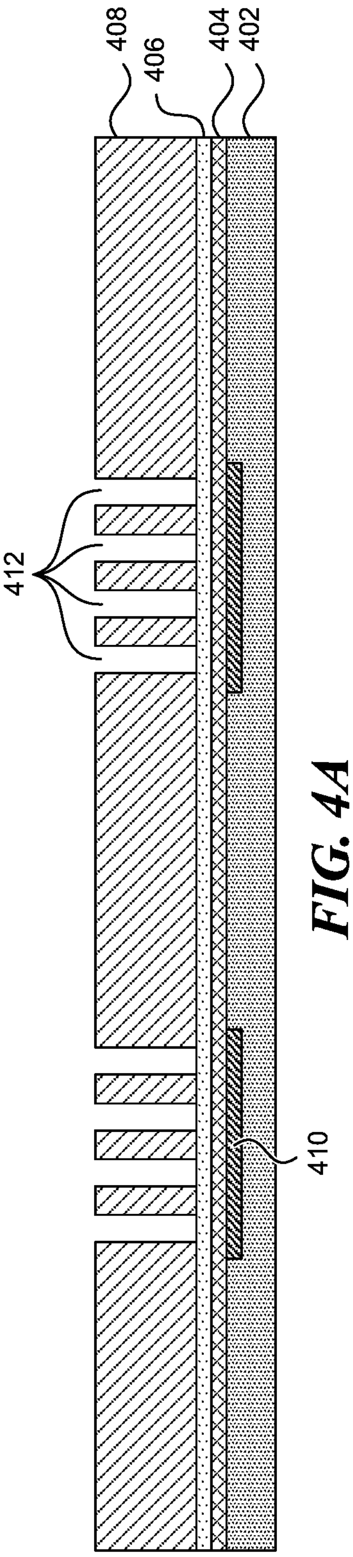
FIGS. 4A-4K are side cross-sectional views of a semiconductor package at various stages of a manufacturing process, in accordance with embodiments of the present technology.

Referring first to FIG. 4A, the method includes providing a semiconductor die 402 including one or more bond pads 410. The method can optionally include applying a first seed layer 404 (e.g., a titanium layer) to the semiconductor die 402 and/or applying a second seed layer 406 (e.g., a copper layer) over the first seed layer 404. The method further includes applying a photoresist material 408 on a semiconductor die 402 and over the first and/or second seed layers 404, 406 (if present), in accordance with techniques known to those of skill in the art. The method can further include patterning the region of the photoresist material 408 above the bond pads 410 to form a set of recesses 412 in the photoresist material 408. The locations and/or geometries of the recesses 412 can correspond to the desired locations and/or geometries of the conductive elements.

Figure 4B:
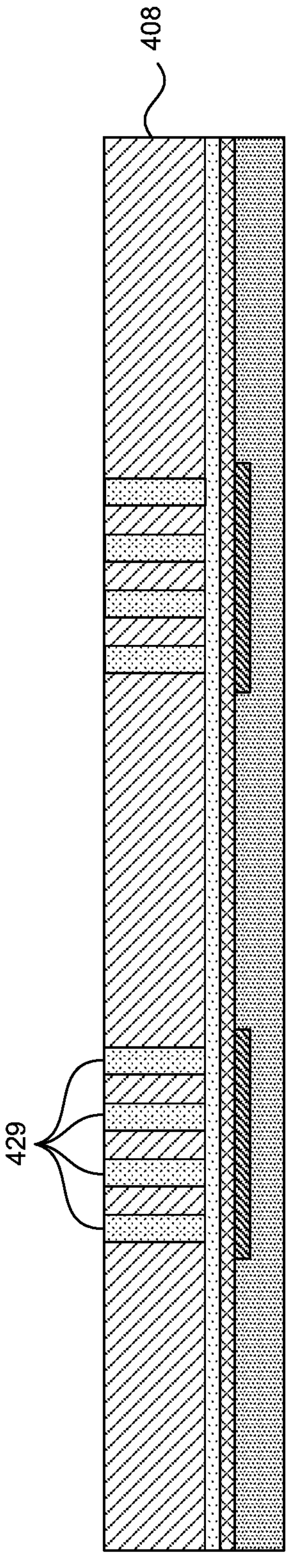

Referring next to FIG. 4B, the method further includes depositing a first conductive material 429 (e.g., copper, nickel, etc.) into the recesses 412 (FIG. 4A) of the patterned photoresist material 408. The first conductive material 429 can be deposited using any suitable technique known to those of skill in the art, such as plating, chemical vapor deposition, physical vapor deposition, atomic layer deposition, electroless plating, spin coating, and/or other suitable techniques.

Figure 4C:
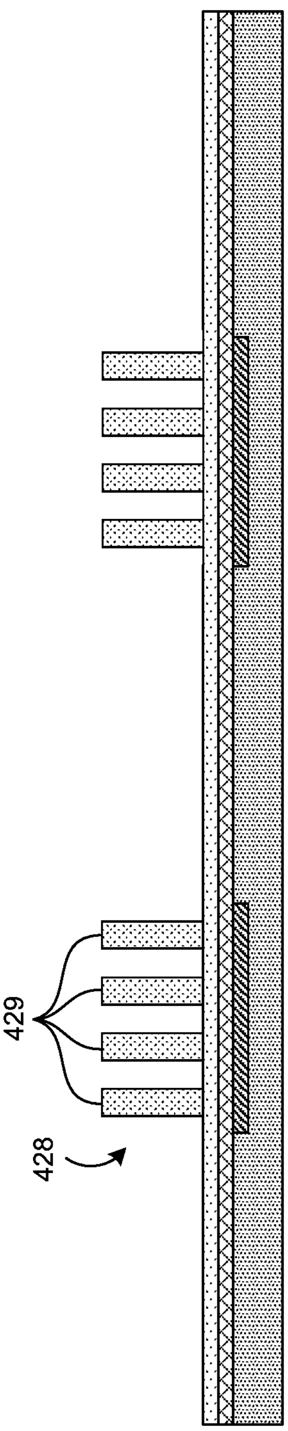

Referring next to FIG. 4C, the method further includes removing the photoresist material 408 after the first conductive material 429 has been deposited in the recesses 412. The first conductive material 429 can form a set of conductive elements 428 electrically coupled to the semiconductor die 402. While the conductive elements 428 illustrated in FIG. 4C includes a plurality of columns (e.g., similar to the conductive elements 228 of FIGS. 2A-2C), in other embodiments, the conductive elements 428 can be configured according to any of the embodiments discussed with respect to FIGS. 2A-3F, or any other suitable embodiment in accordance with the present technology.

Figures 4D, 4E, 4F:
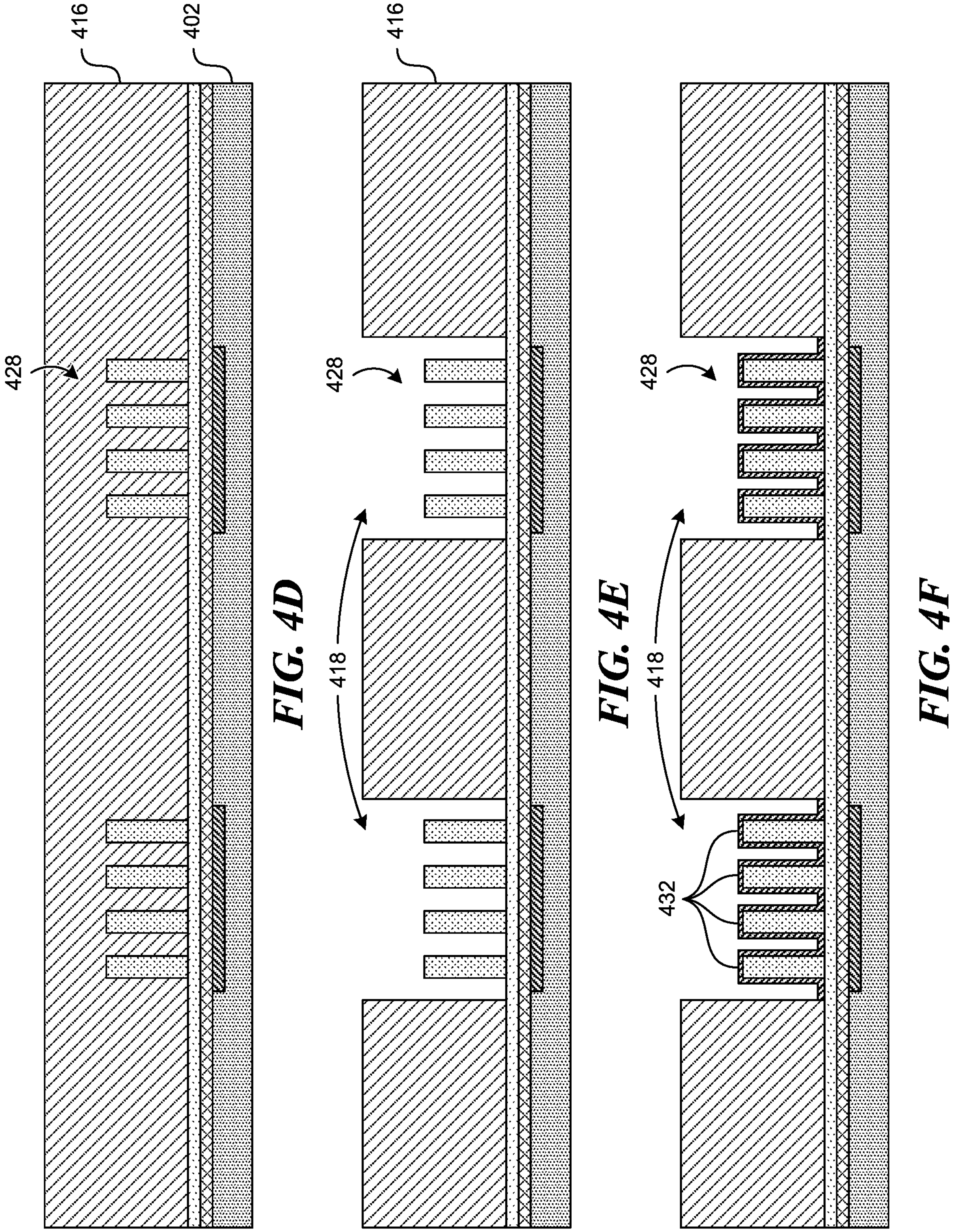

Referring next to FIG. 4D, the method further includes depositing another photoresist material 416 to at least partially cover the semiconductor die 402 and the conductive elements 428, in accordance with techniques known to those of skill in the art. The thickness of the photoresist material 416 can be greater than the height of the conductive elements 428.

Referring next to FIG. 4E, the method further includes removing portions of the photoresist material 416 above and/or around the conductive elements 428 to form recesses 418. The geometry of the recesses 418 can correspond to the desired geometry of the pillar structure to be formed. For example, the cross-sectional shape of each recess 418 can correspond to the cross-sectional shape of the pillar structure to be formed (e.g., a circular cross-sectional shape).

Referring next to FIG. 4F, the method optionally includes depositing a barrier material 432 (e.g., nickel) in the recess 418 to at least partially cover the exposed surfaces of the conductive elements 428. The barrier material 432 can be deposited using plating and/or other suitable technique known to those of skill in the art.

Figure 4G:
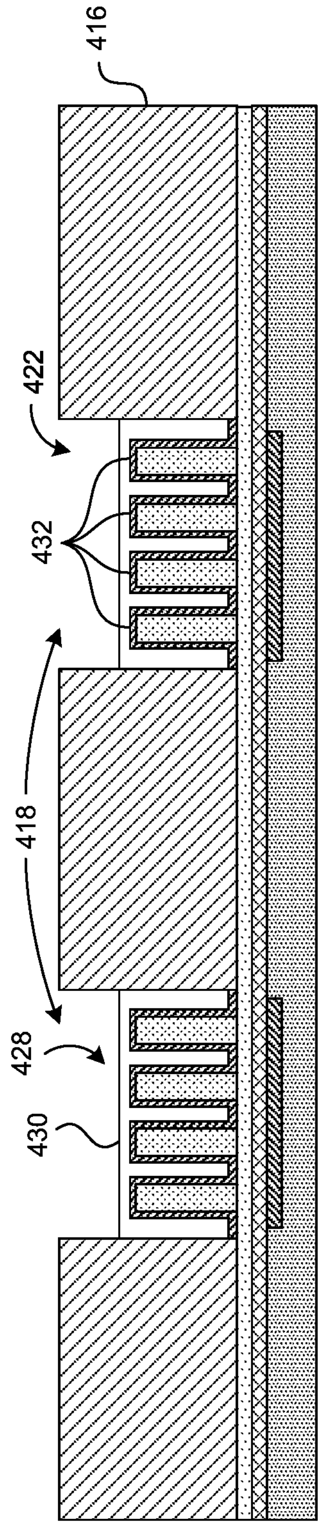

Referring next to FIG. 4G, the method further includes depositing a second conductive material 430 (e.g., a first solder material) in the recesses 418 to at least partially cover the conductive elements 428 and, if present, the barrier material 432. As previously described, the second conductive material 430 can partially or fully surround the conductive elements 428, thus forming a solid pillar structure 422.

The second conductive material 430 can be deposited using plating and/or any other suitable process known to those of skill in the art. The volume of the second conductive material 430 added to the recesses 418 can be such that the second conductive material 430 covers and/or encapsulates the conductive elements 428 but only partially fills the recesses 418. For example, in the illustrated embodiment, the second conductive material 430 covers the conductive elements 428 and the barrier material 432, but does not completely fill the recesses 418, such that the height of the pillar structure 422 is less than the total thickness of the photoresist material 416.

Figure 4H:
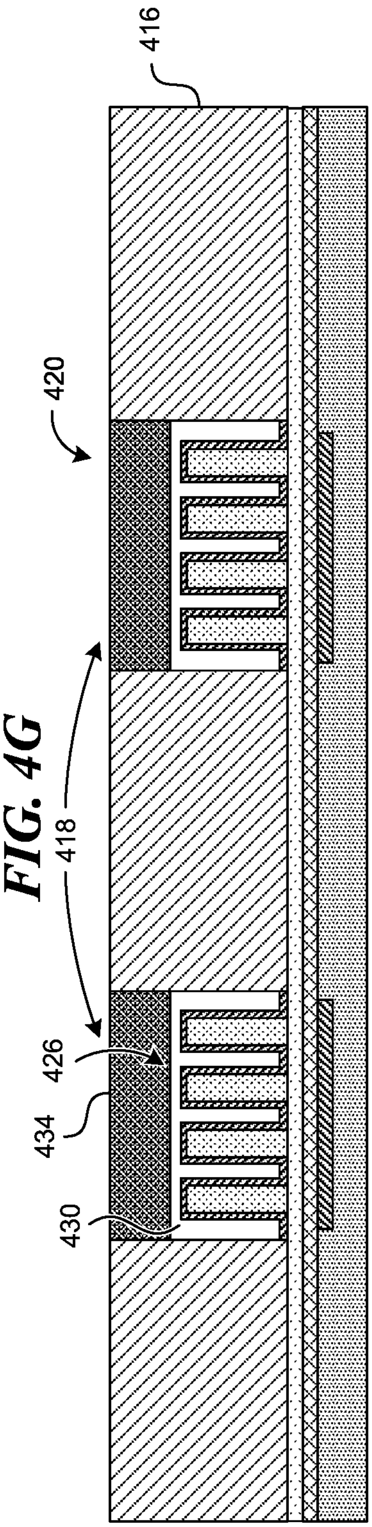
Figure 4I:
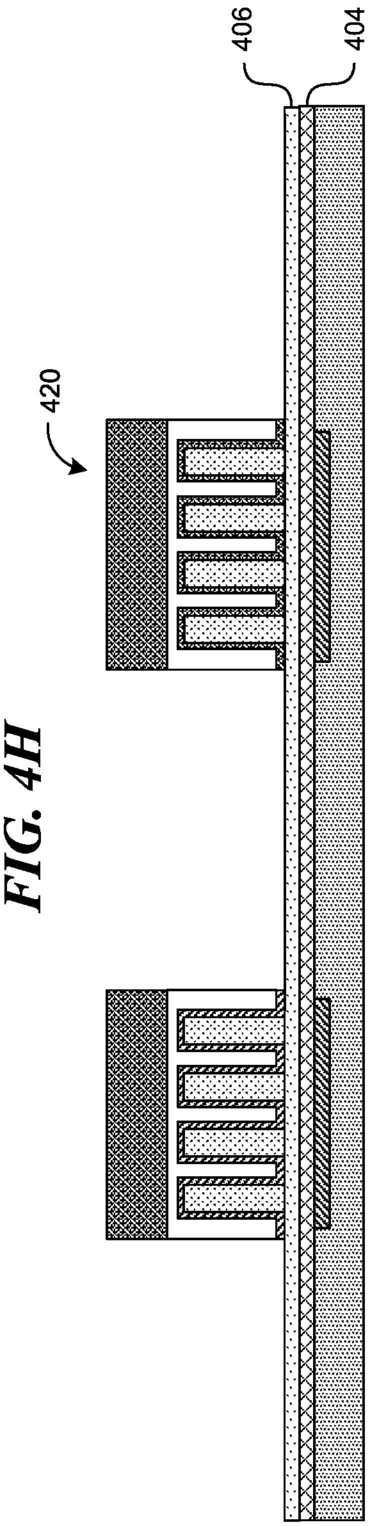

Referring next to FIG. 4H, the method optionally includes depositing a third conductive material 434 (e.g., a second solder material) in the recesses 418 onto an end portion 426 of the pillar structure 422, thus forming an interconnect structure 420. The third conductive material 434 can be the same or different as the second conductive material 430, as previously discussed. The third conductive material 434 can be deposited using plating and/or any other suitable technique.

Figure 4J:
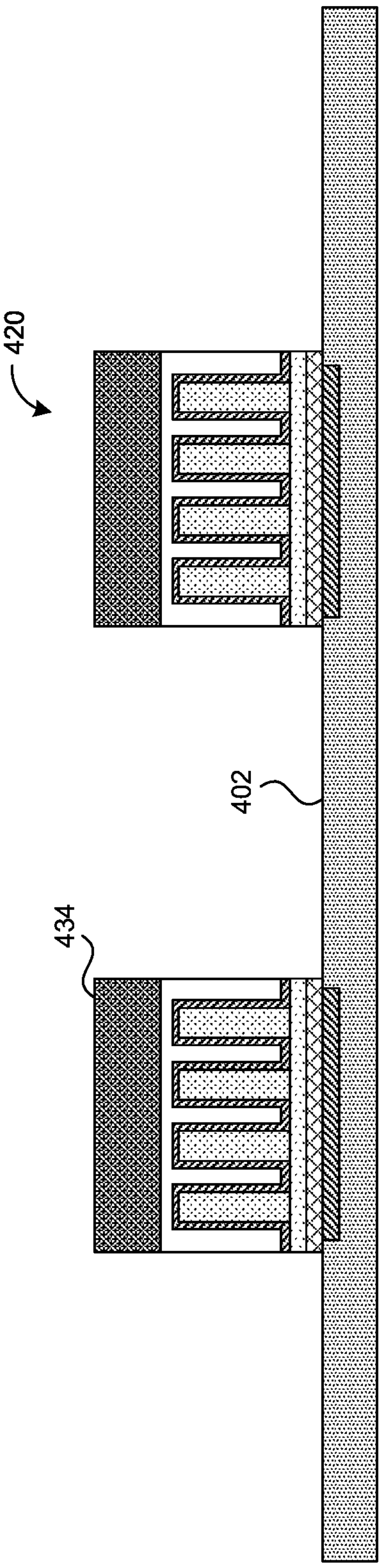

Referring next to FIG. 4J, the method includes removing the photoresist material 416 to expose the interconnect structure 420, using photoresist stripping techniques known to those of skill in the art.

Referring next to FIG. 4J, the method optionally includes removing the portions of the first seed layer 404 and the second seed layer 406 around the interconnect structure 420 from the semiconductor die 402, e.g., by etching (e.g., anisotropic etching utilizing the third conductive material 434 as a mask) and/or other suitable processes.

Figure 4K:
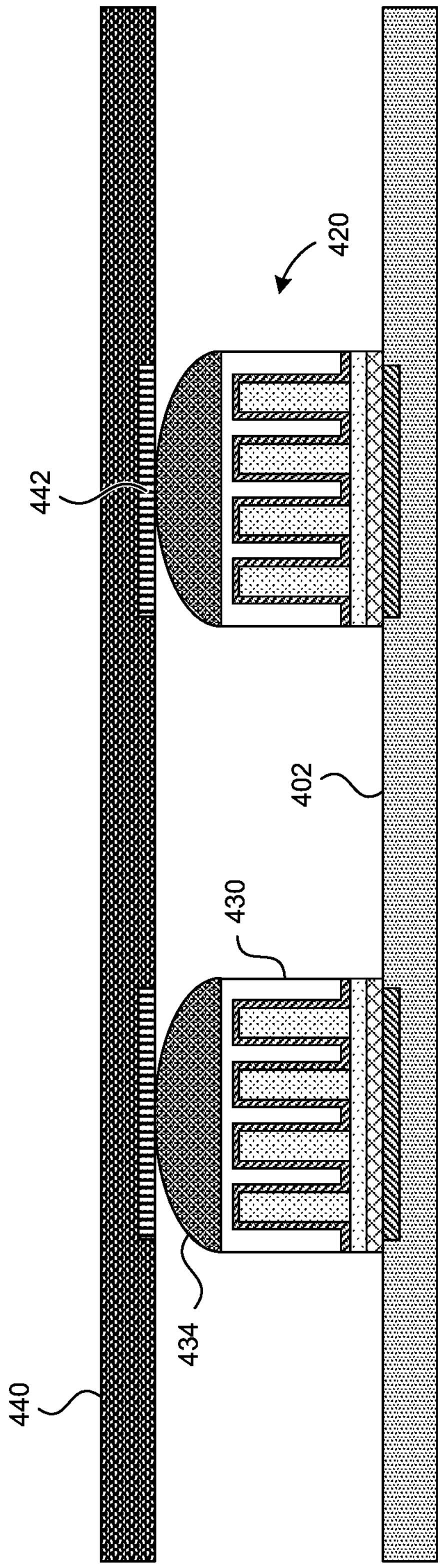

Referring next to FIG. 4K, the method optionally includes using a TCB/reflow process to electrically and mechanically couple the semiconductor die 402 and interconnect structure 420 to another component 440 such as a package substrate or semiconductor die. The component 440 can include one or more bond pads 442 that can each be electrically and mechanically coupled to the third conductive material 434 of a respective interconnect structure 420 during the TCB/reflow process. As described above, the second conductive material 430 can have a higher melting temperature than the third conductive material 434, such that the heat in the TCB/reflow process melts the third conductive material 434 while the second conductive material 430 remains substantially or fully solid.

Figure 5:
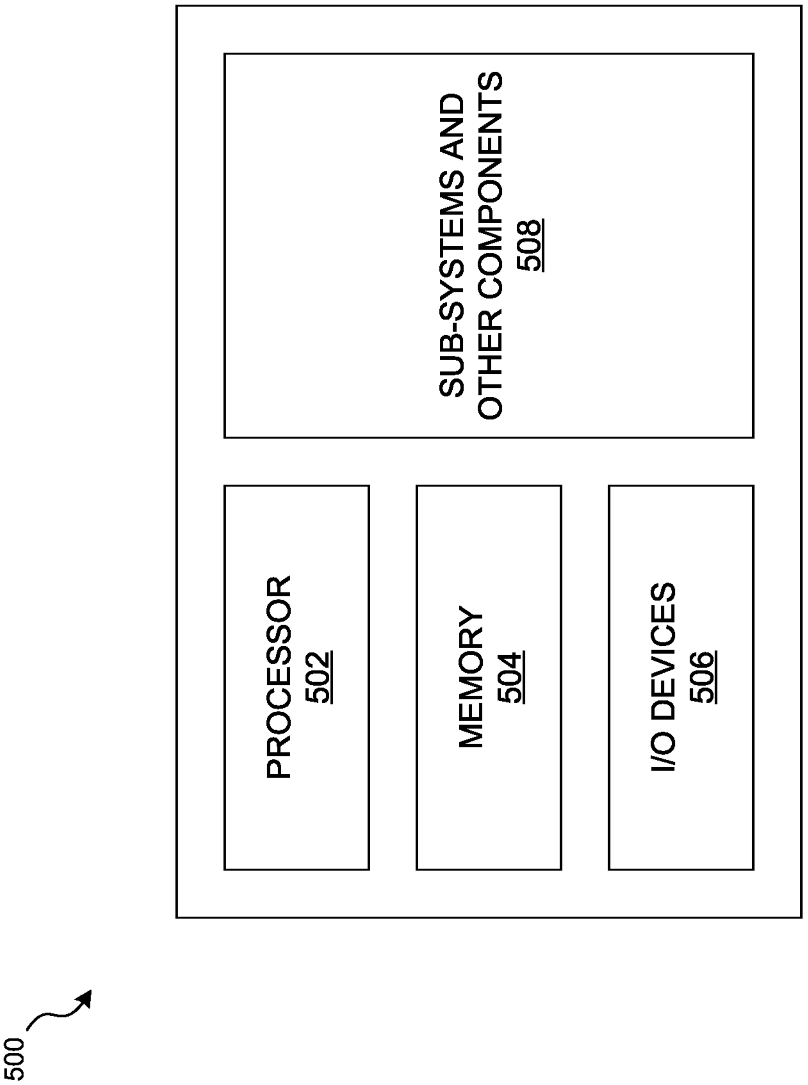
FIG. 5 is a schematic view of a system that includes a semiconductor device or package configured in accordance with embodiments of the present technology.

Any one of the semiconductor devices and/or packages having the features described above with reference to FIGS. 2A-4K can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 506, and/or other subsystems or components 508. The semiconductor dies, packages, and/or interconnects described above with reference to FIGS. 1A-3F can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other example, the system 500 can be housed in a single unit or distributed over multiple interconnected units, e.g., through a communication network. The components of the system 500 can accordingly include local and/or remote memory storage devices and any of a wide variety of suitable computer-readable media.

Figure 6A:
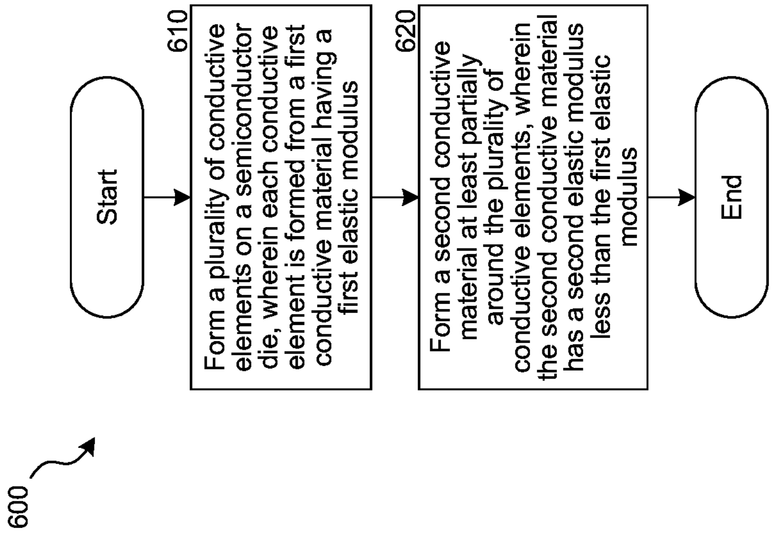
FIG. 6A is a block diagram illustrating a method of manufacturing a semiconductor package, in accordance with embodiments of the present technology.
Figure 6B:
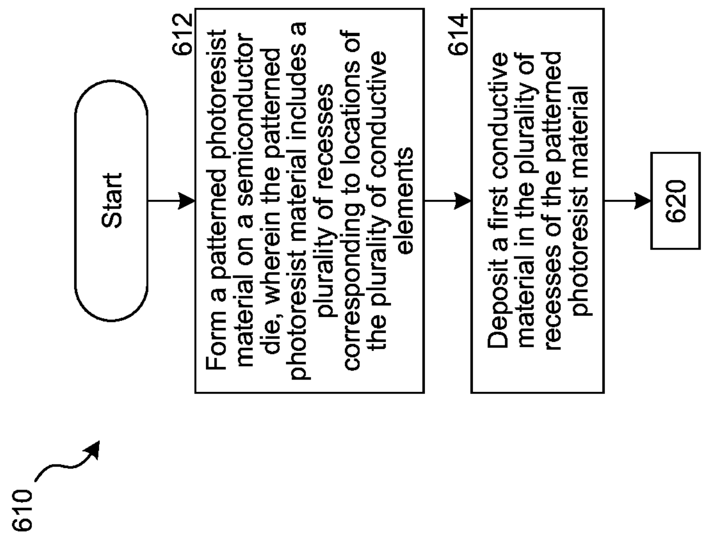
FIG. 6B is a block diagram illustrating a method of manufacturing an element of the method of FIG. 6A, in accordance with embodiments of the present technology.
Figure 6C:
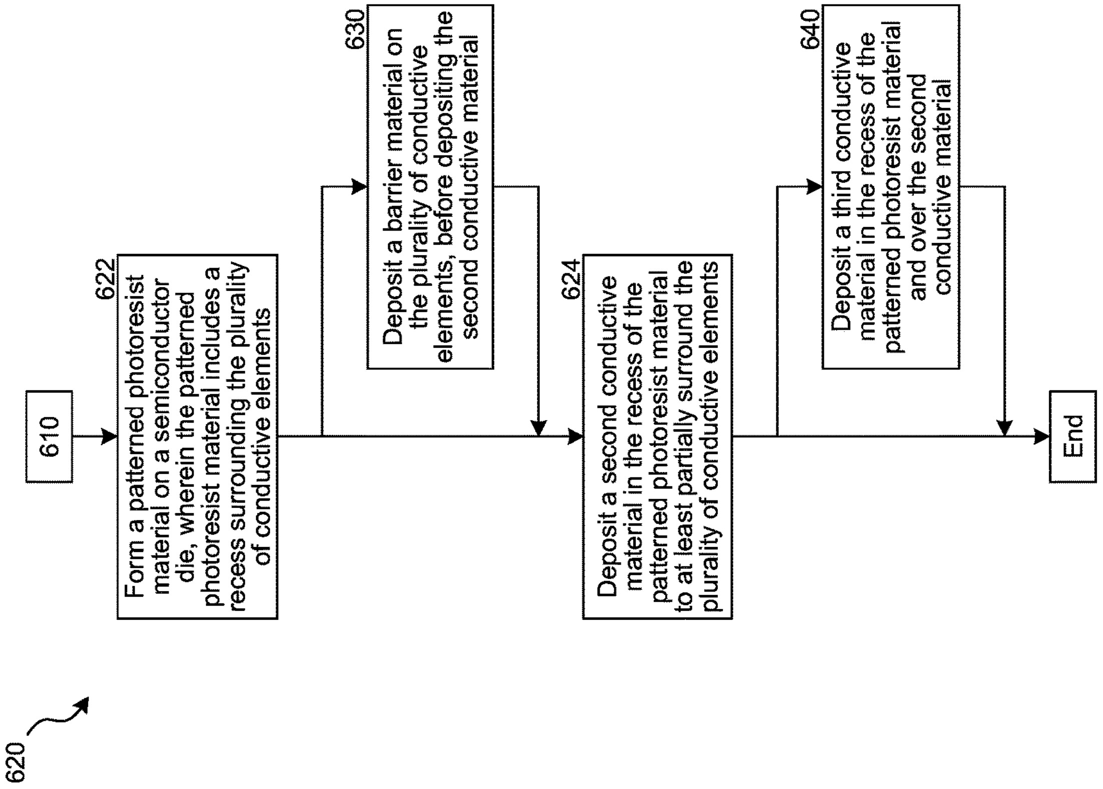
FIG. 6C is a block diagram illustrating a method of manufacturing another element of the method of FIG. 6A, in accordance with embodiments of the present technology.

FIG. 6A is block diagram illustrating a method 600 of manufacturing a semiconductor package, in accordance with embodiments of the present technology. The method 600 can be used to manufacture any embodiment of the semiconductor packages described herein, and/or one or more components thereof (e.g., pillar structures 222 of FIGS. 2A-2C, pillar structures 322*a-f* of FIGS. 3A-3F). FIG. 6B is a block diagram illustrating a method of manufacturing block 610 of the method 600. FIG. 6C is a block diagram illustrating a method of manufacturing block 620 of the method 600. The method 600, block 610, and/or block 620 can be accomplished using techniques whose details are well-known to those of skill in the art, include the techniques discussed previously with respect to FIG. 4.

Referring to FIG. 6A, the method 600 includes forming a plurality of conductive elements on a semiconductor die, wherein each conductive element is formed from a first conductive material having a first elastic modulus (block 610). The method 600 further includes forming a continuous region of a second conductive material at least partially around the plurality of conductive elements, wherein the second conductive material has a second elastic modulus less than the first elastic modulus (block 620).

Referring to FIG. 6B, forming the plurality of conductive elements (block 610 of method 600) can include forming a patterned photoresist material on a semiconductor die, wherein the patterned photoresist material includes a plurality of recesses corresponding to locations of the plurality of conductive elements (block 612). Forming a plurality of conductive elements (block 610) can further include depositing a first conductive material in the plurality of recesses of the patterned photoresist material (block 614).

Referring to FIG. 6C, the forming the continuous region of the second conductive material (block 620 of method 600) can include forming a patterned photoresist material on a semiconductor die, wherein the patterned photoresist material includes a recess surrounding the plurality of conductive elements (block 622). Block 620 of method 600 can further include depositing the second conductive material in the recess of the patterned photoresist material to at least partially surround the plurality of conductive elements (block 624). The method 600 can optionally include depositing a barrier material on the plurality of conductive elements (block 630), before depositing the second conductive material (block 624). The method 600 can also optionally include depositing a third conductive material in the recess of the patterned photoresist material and over the second conductive material (block 640).

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:

a semiconductor die; and a pillar structure coupled to the semiconductor die, wherein the pillar structure includes— a plurality of conductive elements, each electrically coupled to and extending linearly away from the semiconductor die, wherein each conductive element includes a first conductive material having a first elastic modulus, and a continuous region of a second conductive material at least partially surrounding the plurality of conductive elements, the second conductive material having a second elastic modulus less than the first elastic modulus.

2. The semiconductor device of claim 1 wherein the plurality of conductive elements includes a plurality of columns extending from the semiconductor die.

3. The semiconductor device of claim 2 wherein the plurality of columns each have a circular cross-sectional shape or a square cross-sectional shape.

4. The semiconductor device of claim 1 wherein the plurality of conductive elements includes a plurality of nested structures.

5. The semiconductor device of claim 1 wherein a volume of the first conductive material is within a range from 1% to 30% of a total volume of the pillar structure.

6. The semiconductor device of claim 1 wherein the first conductive material comprises copper or nickel, and the second conductive material comprises a solder material.

7. The semiconductor device of claim 1 wherein the pillar structure includes a first end portion coupled to the semiconductor die and a second end portion away from the semiconductor die, and wherein the semiconductor device further comprises a third conductive material coupled to the second end portion of the pillar structure.

8. The semiconductor device of claim 7 wherein the second conductive material comprises a first solder material, and the third conductive material comprises a second solder material.

9. The semiconductor device of claim 8 wherein the first solder material has a different melting temperature than the second solder material.

10. The semiconductor device of claim 9 wherein the first solder material has a higher melting temperature than the second solder material.

11. The semiconductor device of claim 8, further comprising a barrier material between the first conductive material and second conductive material.

12. The semiconductor device of claim 7 wherein the second and third conductive materials are the same solder material.

13. The semiconductor device of claim 7 wherein the third conductive material is electrically coupled to a second semiconductor device.

14. A semiconductor device, comprising:

a semiconductor die; and a pillar structure including a first end portion coupled to the semiconductor die and a second end portion away from the semiconductor die, wherein the pillar structure includes— a plurality of conductive elements, each electrically coupled to and extending linearly away from the semiconductor die, and a first solder material at least partially surrounding the plurality of conductive elements; and a second solder material coupled to the second end portion of the pillar structure, wherein the second solder material is different from the first solder material.

15. The semiconductor device of claim 14 wherein the first solder material has a higher melting temperature than the second solder material.

16. The semiconductor device of claim 14 wherein the first and second solder materials have different Young's moduli.

17. A method of manufacturing a semiconductor device, the method comprising:

forming a plurality of conductive elements on a semiconductor die, wherein each conductive element is formed from a first conductive material having a first elastic modulus; and forming a continuous region of a second conductive material at least partially around the plurality of conductive elements, wherein the second conductive material has a second elastic modulus less than the first elastic modulus.

18. The method of claim 17 wherein forming the plurality of conductive elements comprises:

forming a patterned photoresist material on the semiconductor die, wherein the patterned photoresist material includes a plurality of recesses corresponding to locations of the plurality of conductive elements; and depositing the first conductive material in the plurality of recesses of the patterned photoresist material.

19. The method of claim 17, wherein forming the continuous region of the second conductive material comprises:

forming a patterned photoresist material on the semiconductor die, wherein the patterned photoresist material includes a recess surrounding the plurality of conductive elements; and depositing the second conductive material in the recess of the patterned photoresist material to at least partially surround the plurality of conductive elements.

20. The method of claim 19, further comprising:

depositing a barrier material on the plurality of conductive elements, before depositing the second conductive material.

21. The method of claim 19, further comprising:

depositing a third conductive material in the recess of the patterned photoresist material and over the second conductive material.

* * * * *